(12) United States Patent
Makino et al.

(10) Patent No.: US 7,901,550 B2
(45) Date of Patent: Mar. 8, 2011

(54) PLATING APPARATUS

(75) Inventors: Natsuki Makino, Tokyo (JP); Keisuke Namiki, Tokyo (JP); Kunihito Ide, Kanagawa (JP); Junji Kunisawa, Tokyo (JP); Katsuyuki Musaka, Chiba (JP)

(73) Assignee: Ebara Corporation, Tokyo (JP)

( * ) Notice: Subject to any disclaimer, the term of this patent is extended or adjusted under 35 U.S.C. 154(b) by 714 days.

(21) Appl. No.: 11/907,591

(22) Filed: Oct. 15, 2007

(65) Prior Publication Data
US 2009/0095618 A1  Apr. 16, 2009

(51) Int. Cl.
*C25D 17/06* (2006.01)
(52) U.S. Cl. .......... 204/297.01; 204/297.03; 204/297.06; 204/297.08; 204/297.09; 204/297.1; 204/297.14; 204/224 R
(58) Field of Classification Search ............. 204/297.01, 204/297.03, 297.06, 297.08, 297.09, 297.1, 204/297.14, 224 R
See application file for complete search history.

(56) References Cited

U.S. PATENT DOCUMENTS

| | | | |
|---|---|---|---|
| 6,589,401 B1* | 7/2003 | Patton et al. | 204/212 |
| 2005/0023149 A1* | 2/2005 | Nakada et al. | 205/137 |
| 2005/0145482 A1* | 7/2005 | Suzuki et al. | 204/199 |
| 2008/0099340 A1* | 5/2008 | Kanda et al. | 205/219 |
| 2009/0095634 A1* | 4/2009 | Makino et al. | 205/223 |

* cited by examiner

*Primary Examiner* — Bruce F Bell
(74) *Attorney, Agent, or Firm* — Wenderoth, Lind & Ponack, L.L.P.

(57) ABSTRACT

A plating apparatus can form a plated film having a uniform thickness over the entire surface of a substrate without a change of members. The plating apparatus includes a substrate holder, a cathode contact for contacting a conductive film formed on the substrate so that the conductive film serves as a cathode, a ring-shaped seal member for covering the cathode contact and bringing its inner circumferential portion into contact with the peripheral portion of the substrate to seal the peripheral portion of the substrate, an anode disposed so as to face the conductive film formed on the substrate, and an auxiliary cathode disposed with respect to the seal member such that at least part of the auxiliary cathode is exposed on a surface of the seal member. Plating is carried out by bringing the conductive film, the anode and the auxiliary cathode into contact with a plating solution.

3 Claims, 13 Drawing Sheets

F I G. 1 7
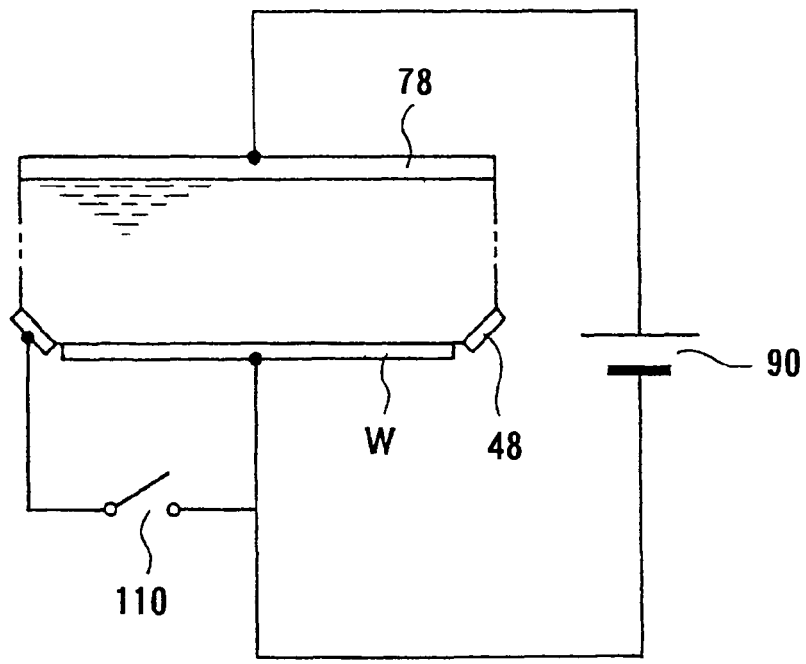
F I G. 1 8
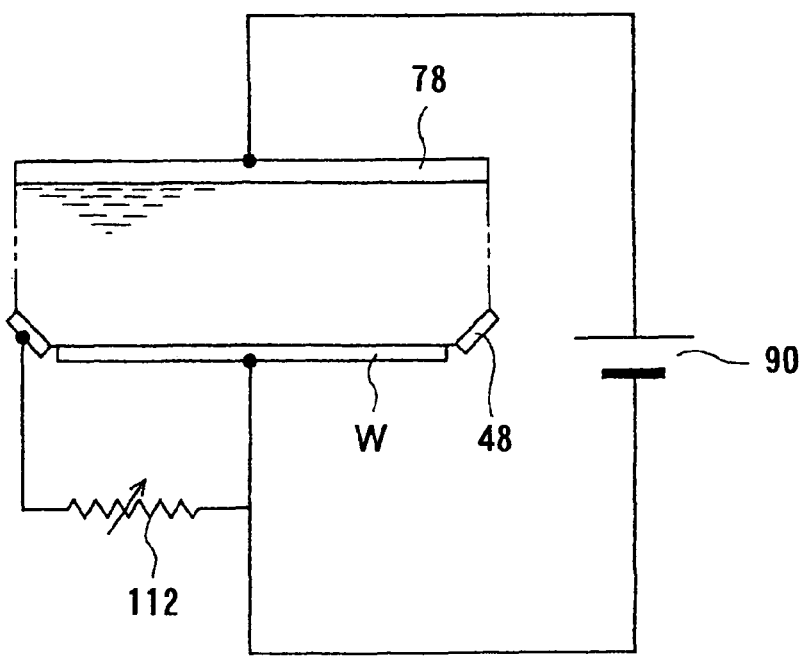

PLATING APPARATUS

BACKGROUND OF THE INVENTION

1. Field of the Invention

The present invention relates to a plating apparatus, and more particularly to a plating apparatus used for filling interconnect recesses formed in a substrate, such as a semiconductor wafer, with an electrical conductor (interconnect material), such as copper or silver, so as to form interconnects.

2. Description of the Related Art

In recent years, instead of using aluminum or aluminum alloys as a metallic material for forming interconnect circuits on a substrate, there is an eminent movement towards using copper (Cu) that has a low electric resistivity and high electromigration resistance. Copper interconnects are generally formed by filling copper into fine interconnect recesses formed in a surface of a substrate. There are various known techniques for forming such copper interconnects, including CVD, sputtering, and plating. According to any such technique, a copper film is formed in a substantially entire surface of a substrate, followed by removal of unnecessary copper by performing chemical mechanical polishing (CMP).

FIGS. 1A through 1C illustrate, in a sequence of process steps, an example of forming such a substrate W having copper interconnects. First, as shown in FIG. 1A, an insulating film 2, such as an oxide film of $SiO_2$ or a Low-k material film, is deposited on a conductive layer 1a on a semiconductor base 1 having formed semiconductor devices. Contact holes 3 and trenches 4 for interconnect recesses are formed in the insulating film 2 by performing a lithography/etching technique. Thereafter, a barrier layer 5 of Ta, TaN, TiN, WN, SiTiN, CoWP, CoWB, or the like is formed on the insulating film 2, and a seed layer (conductive film) 7 as an electric supply layer for electroplating is formed on the barrier layer 5.

Then, as shown in FIG. 1B, copper plating is performed onto a surface of the seed layer 7 of the substrate W to fill the contact holes 3 and the trenches 4 with copper and, at the same time, deposit a copper film 6 on the insulating layer 2. Thereafter, the copper film 6, the seed layer 7 and the barrier layer 5 on the insulating film 2 are removed by performing chemical mechanical polishing (CMP) so as to make the surface of the copper filled in the contact holes 3 and the trenches 4 and the surface of the insulating film 2 lie substantially on the same plane. Interconnects composed of the copper film 6, as shown in FIG. 1C, are thus formed in the insulating film 2.

In forming copper interconnects in an insulating film, preformation of a seed layer having a thickness of about 60 to 100 nm on the surfaces of trenches and contact holes formed in the insulating film is widely practiced, as described above. A seed layer is a conductive film for flowing a current to a substrate immediately after the start of plating when a copper film is not sufficiently grown. A seed layer is formed prior to plating by sputtering or the like.

In recent years, the sizes of trenches and contact holes are becoming smaller for the purpose of increasing the integration density of semiconductor devices. With the trend toward smaller-sized trenches and contact holes, the following problem has become serious: When a seed layer 7 having a conventional thickness is formed on a surface of a barrier layer 5 which covers surfaces of smaller-sized trenches 4 and contact holes 3, the seed layer 7 may hand considerably inwardly over the openings of the trenches 4 and contact holes 3 such that it blocks in the openings, thus narrowing the openings, as shown in FIG. 2. This impedes electrodeposition of copper in the trenches 4 and contact holes 3 in the next plating step, whereby voids are likely to be formed within the interconnects formed of a plated film, lowering the reliability of the interconnects.

One method to solve the above problem is to make a thickness of a seed layer 7 smaller. Plating on a thinner seed layer 7, however, entails the following problem. As shown in FIG. 3, the sheet resistance R2 of the seed layer 7 between its center and its peripheral electricity-feeding portion becomes relatively higher than the resistance R1 of a plating solution 202 present between an anode 200, connected to the anode of a plating power source 206, and the surface seed layer (conductive film) 7 of a substrate W, connected to the cathode of the plating power source 206 (R1<<R2). As a result, a higher current flows in the peripheral region, having a lower electric resistance, of the seed layer 7. Accordingly, the plated film produced by plating has a film thickness profile as shown in FIG. 4, indicating a thin film in the central region of the substrate and a gradually thicker film in the peripheral region of the substrate. When carrying out CMP or the like of the substrate, having such a thick plated film formed in the peripheral region, to remove an extra plated film and flatten an entire surface of the substrate, a longer processing (polishing) time is needed in a CMP process or the like, thus lowering the productivity.

A known method for improving such an uneven thickness of a plated film is to interpose a high resistance structure 204a between the anode 200 and the substrate, as shown in FIG. 5. The higher resistance structure 204a allows the plating solution 202 to penetrate into it through complicated paths, and hence has a higher resistance than the resistance of the plating solution 202 itself. A thickness of the high-resistance structure 204a is made to increase gradually with the distance from the center to the periphery so as to incline the electric resistance distribution in the radial direction of the substrate, thereby making the current density distribution uniform over the substrate. Another known method is to interpose an insulating ring 206 between the anode 200 and a flat plate-shaped high-resistance structure 204b in their peripheral regions, as shown in FIG. 6. The shielding of electric current by the insulating ring 206 can prevent an excessive current from flowing locally (peripheral region of the substrate).

These methods, however, necessitate additionally preparing, for example, a high-resistance structure 204a having a different thickness distribution or an insulating ring 206 having a different width, and replacing the old one with such new one whenever a thickness of a plated film obtained by plating falls out of its standard. This not only increases the component cost, but also entails downtime in an actual semiconductor device manufacturing process, resulting in a lowered throughput.

A method has also been proposed in which a lattice-like or net-like auxiliary cathode, which can control the current proportion, is disposed between a substrate and an anode, and a voltage is applied between the anode and the substrate, and also between the anode and the auxiliary cathode in carrying out plating, thereby improving the uniformity of a thickness of a plated film (see Japanese Patent Laid-Open Publication No. 2006-89810). However, in view of the fact that such auxiliary cathode covers the entire surface (surface to be plated) of the substrate, it is considered that the uniformity of a plated film cannot be improved selectively in the vicinity of a cathode contact, i.e., in the outermost peripheral region of the substrate, where a plated film is likely to become thick due to the concentration of electric current.

SUMMARY OF THE INVENTION

The present invention has been made in view of the above situation in the related art. It is therefore an object of the present invention to provide a plating apparatus which can form a plated film having a uniform thickness over the entire surface, including the peripheral surface, of a substrate without a change of members even when a conductive film, such as a seed layer, has a small thickness.

In order to achieve the above object, the present invention provides a plating apparatus including: a substrate holder for holding a substrate; a cathode contact for contacting a conductive film formed on the substrate held by the substrate holder to feed electricity to the conductive film so that the conductive film serves as a cathode; a ring-shaped seal member for covering the cathode contact and bringing its inner circumferential portion into contact with the peripheral portion of the substrate held by the substrate holder to seal the peripheral portion of the substrate; an anode disposed so as to face the conductive film formed on the substrate held by the substrate holder; and an auxiliary cathode mounted to the seal member such that at least a part of the auxiliary cathode is exposed on a surface of the seal member. Plating is carried out by bringing the conductive film, the anode and the auxiliary cathode into contact with a plating solution.

There is a case in which due to a thinness of a conductive film, such as a seed layer, a plated film is formed by ordinary plating, which film has such a profile that the thickness gradually increases with distance from the center of a substrate and increases sharply in the vicinity of a cathode contact, i.e., in the outermost peripheral region of the substrate. According to the present invention, a voltage is applied between the anode and a substrate, and also between the anode and the auxiliary cathode in carrying out plating. This allows an excessive electric current, flowing from the anode toward the substrate in the vicinity of the periphery of the substrate, to flow into the auxiliary cathode, thereby reducing a thickness of a plated film selectively in the peripheral region of the substrate and thus improving the in-plane uniformity of the thickness of the plated film formed.

Further, by providing the auxiliary cathode in the seal member such that the auxiliary cathode is either formed integrally with the seal member or fixed on the seal member, good accessibility of a worker, engaging in maintenance of the apparatus, to the auxiliary cathode can be secured, facilitating maintenance of the apparatus.

Preferably, the plating apparatus comprises a high-resistance structure disposed between the anode and the substrate.

By thus disposing the high-resistance structure, which is made to have a higher resistance than the resistance of a plating solution itself, between the anode and the substrate, the influence of the resistance of a conductive film, such as a seed layer, formed in the surface (surface to be plated) of the substrate, can be made as small as negligible. This can reduce an in-plane difference in current density due to the surface electric resistance of the substrate, thus enhancing the in-plane uniformity of a plated film.

Preferably, the plating apparatus comprises a control section for controlling a voltage applied between the auxiliary cathode and the anode, or a current flowing between the auxiliary cathode and the anode.

This makes it possible to carry out plating with an appropriate voltage or current applied between the auxiliary cathode and the anode.

Preferably, the plating apparatus comprises an auxiliary cathode cleaning section for cleaning a surface of the auxiliary cathode.

When plating is carried out by supplying an electric current between the auxiliary cathode and the anode, a plated film is formed on a surface of the auxiliary cathode. The unnecessary plated film formed on the surface of the auxiliary cathode can be cleaned off with a cleaning agent supplied from the auxiliary cathode cleaning section, for example. An organic or inorganic acid, such as sulfuric acid, hydrochloric acid, phosphoric acid, hydrofluoric acid or formic acid, or a mixture of such an acid with hydrogen peroxide, can be used effectively as the cleaning agent. Hydrogen peroxide may be used singly. In this case, the auxiliary cathode can be cleaned by supplying a plating solution and hydrogen peroxide simultaneously to the auxiliary cathode.

The auxiliary cathode cleaning section may include a cleaning electrode or dummy substrate, and be adapted to etch away a plated film formed on a surface of the auxiliary cathode by making the auxiliary cathode serve as an anode and the cleaning electrode or dummy substrate as a cathode.

The plating apparatus of the present invention makes it possible to easily correct a thickness profile of a plated film simply by adjusting the current applied to the auxiliary cathode. This enables a lower-cost and flexible apparatus operation in a semiconductor device manufacturing process. Further, the provision of the auxiliary cathode in the seal member by forming the auxiliary cathode integrally with the seal member or fixing the auxiliary cathode on the seal member, can secure good accessibility of the maintenance worker to the auxiliary cathode, facilitating maintenance of the apparatus. Further, by adding a cleaning function of the auxiliary cathode, maintenance can be quite simplified.

BRIEF DESCRIPTION OF THE DRAWINGS

FIG. 17 is a schematic circuit diagram showing another plating circuit;

FIG. 18 is a schematic circuit diagram showing yet another plating circuit;

DETAILED DESCRIPTION OF THE PREFERRED EMBODIMENTS

Figure 1A:
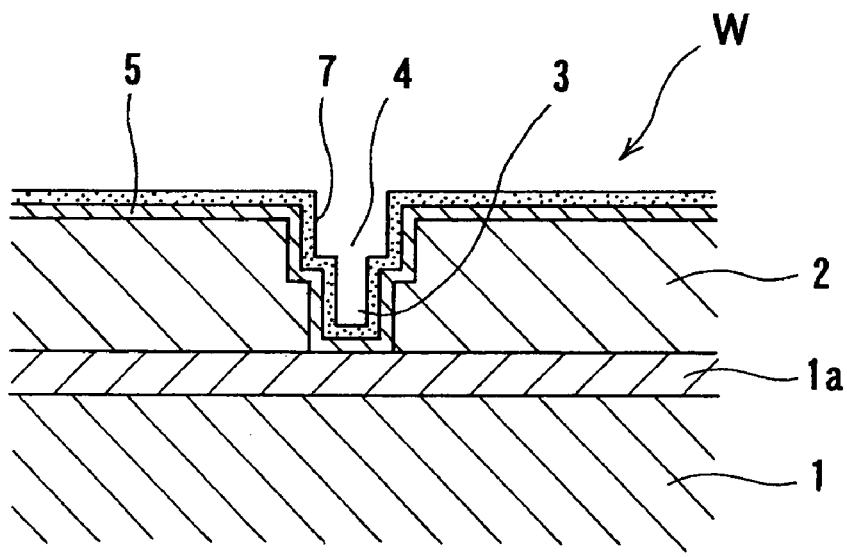
FIGS. 1A through 1C are diagrams illustrating, in a sequence of process steps, a process for producing copper interconnects on a substrate.
Figure 1B:
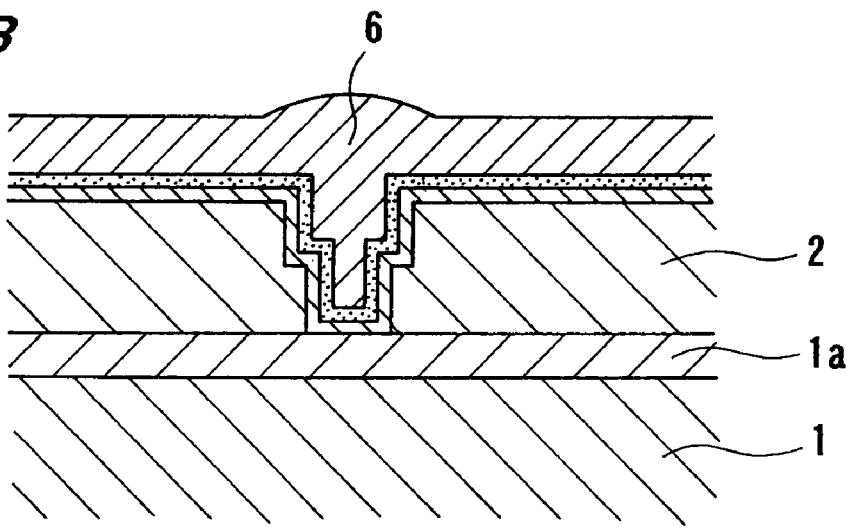
Figure 1C:
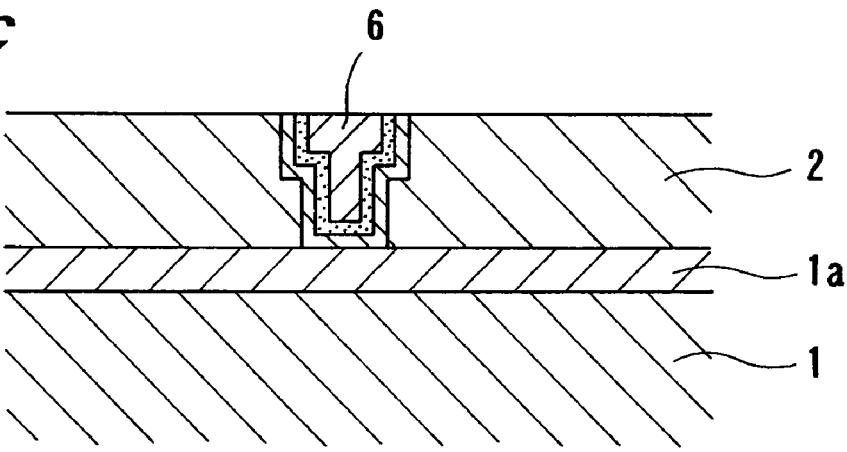
Figure 2:
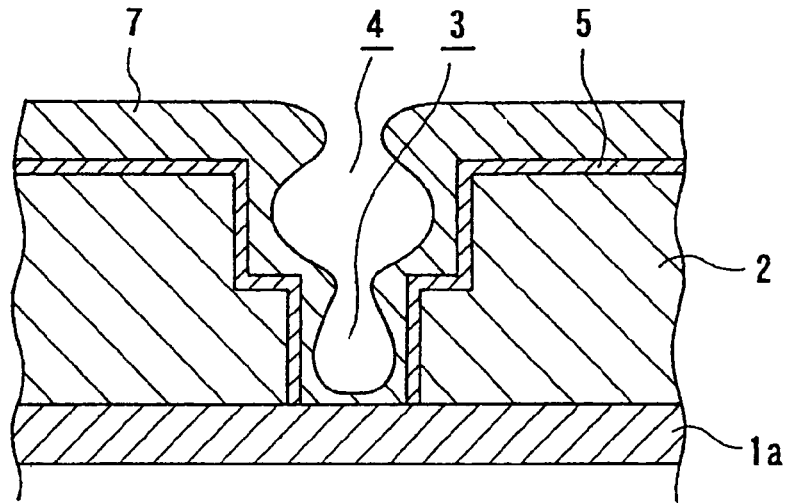
FIG. 2 is a cross-sectional diagram illustrating a substrate when a relatively thick seed layer is formed on surfaces of narrow contact holes and narrow trenches.
Figure 3:
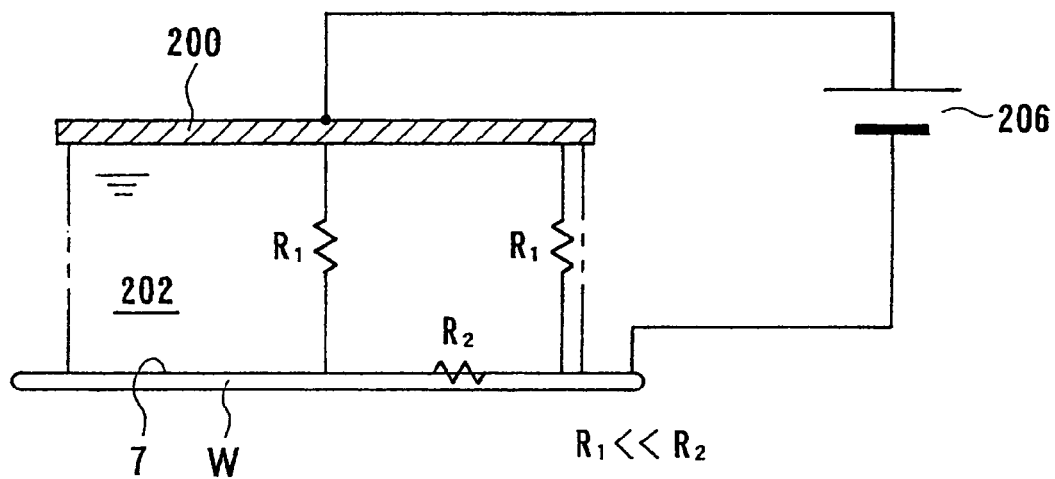
FIG. 3 is a schematic circuit diagram showing a plating circuit including the resistance of plating solution and the sheet resistance of a seed layer.
Figure 4:
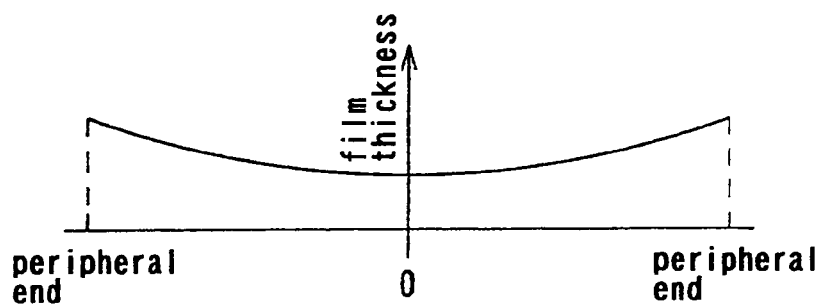
FIG. 4 is a diagram showing a film thickness profile of a plated film formed on a thin seed layer.
Figure 5:
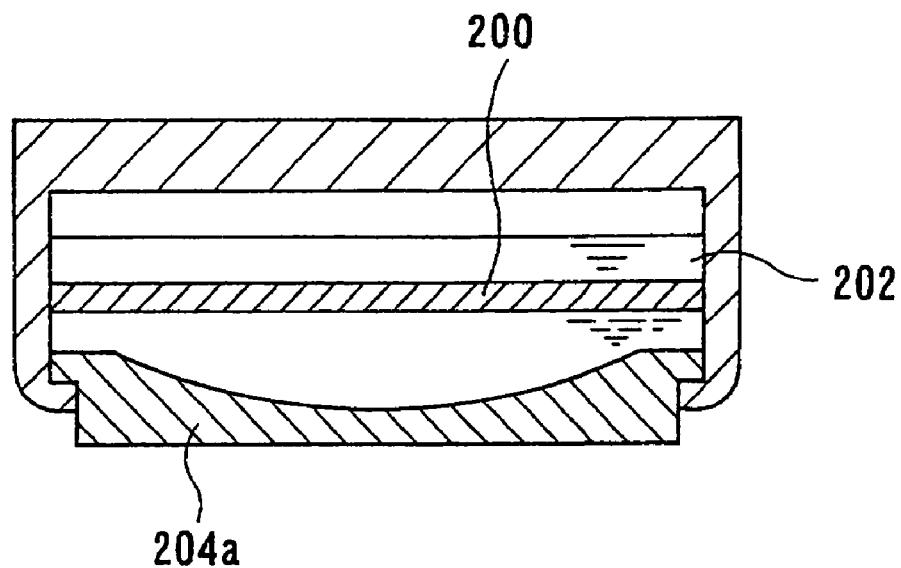
FIG. 5 is a diagram showing the main portion of a conventional plating apparatus.
Figure 6:
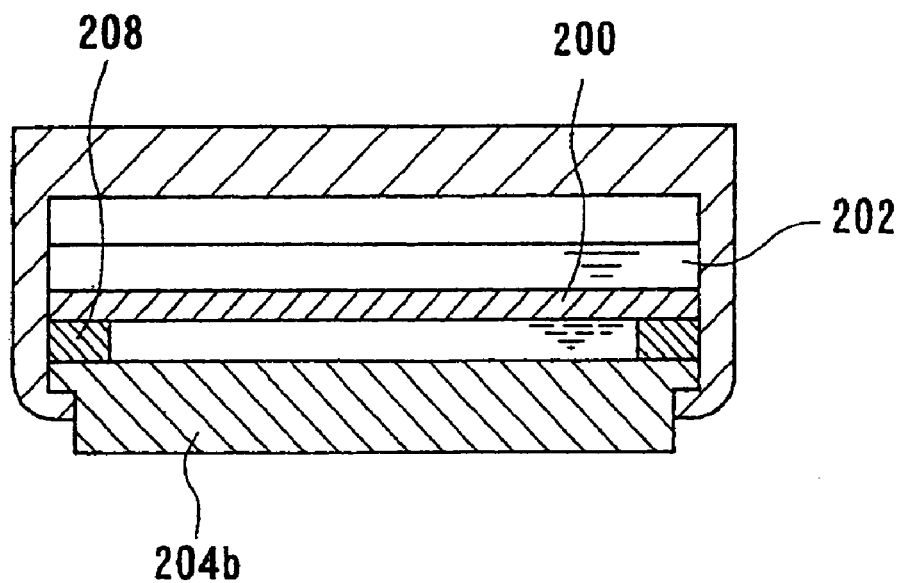
FIG. 6 is a diagram showing the main portion of another conventional plating apparatus.

Preferred embodiments of the present invention will now be described in detail with reference to the drawings. The following embodiments relate to the application of the present invention useful for forming interconnects of copper by filling copper into interconnect recesses, such as contact holes 3 and trenches 4, formed in a insulating film 2 by plating onto a surface of a seed layer 7 as a conductive film having formed on the surface of the substrate W, as shown in FIGS. 1A through 1C.

Figure 7:
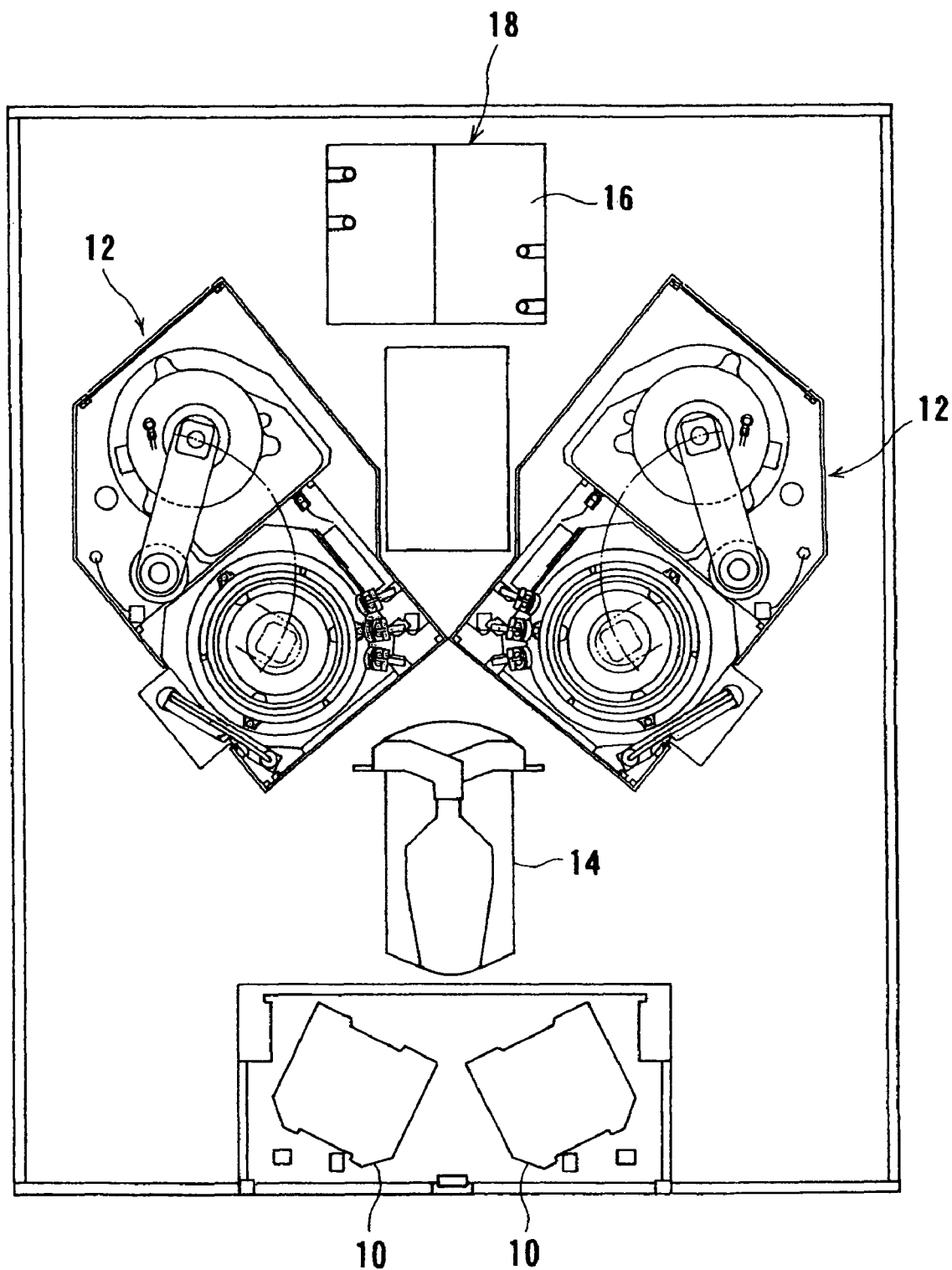
FIG. 7 is an overall plan view of a substrate processing apparatus incorporating a plating apparatus according to an embodiment of the present invention.

FIG. 7 is an overall plan view of a substrate processing apparatus incorporating a plating apparatus according to an embodiment of the present invention. As shown in FIG. 7, this substrate processing apparatus has a facility which houses therein two loading/unloading units 10 for housing a plurality of substrates W therein, two plating apparatuses 12 for performing a plating process and processing incidental thereto, a transfer robot 14 for transferring substrates W between the loading/unloading units 10 and the plating apparatuses 12, and plating solution supply equipment 18 having a plating solution tank 16.

Figure 8:
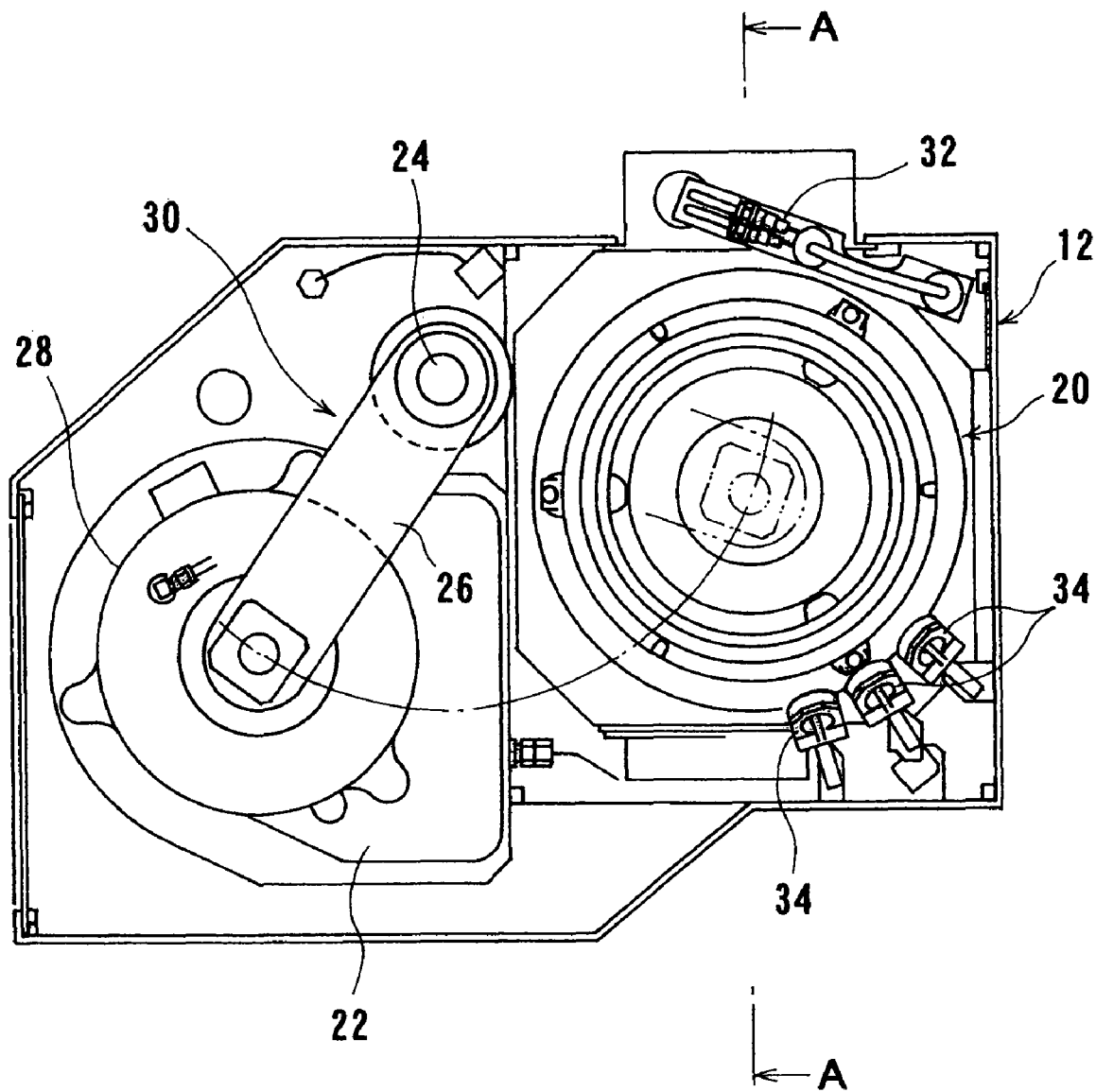
FIG. 8 is a plan view of the plating apparatus shown in FIG. 7.

The plating apparatus 12, as shown in FIG. 8, is provided with a substrate processing section 20 for performing a plating process and processing incidental thereto, and a plating solution tray 22 for storing a plating solution is disposed adjacent to the substrate processing section 20. There is also provided an electrode arm section 30 having an electrode head 28 which is held at the front end of a swing arm 26 swingable about a rotating shaft 24 and which is swung between the substrate processing section 20 and the plating solution tray 22. Furthermore, a pre-coating/recovering arm 32, and fixed nozzles 34 for ejecting pure water or a chemical liquid such as ion water, and also a gas or the like toward a substrate are disposed laterally of the substrate processing section 20. In this embodiment, three of the fixed nozzles 34 are disposed, and one of them is used for supplying pure water.

Figure 9:
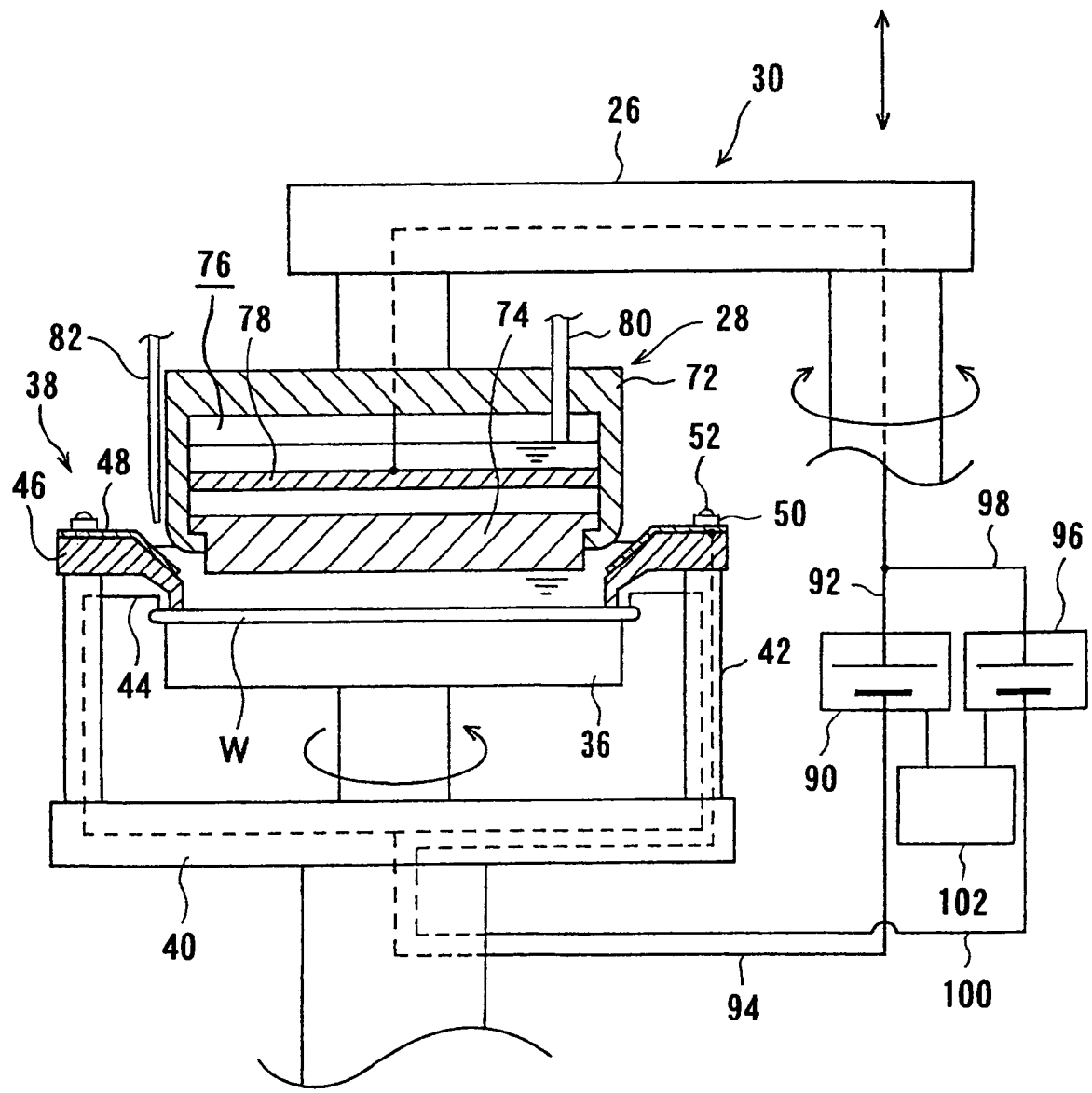
FIG. 9 is a schematic cross-sectional diagram showing an electrode head and a substrate holder of the plating apparatus shown in FIG. 7.

The substrate processing section 20, as shown in FIG. 9, has a vertically moveable substrate holder 36 for detachably holding a substrate W with its surface (surface to be plated), having a seed layer 7 (see FIG. 1A) as a conductive film, facing upwardly by attracting the back surface of the substrate W, and an electrode section 38 located above the substrate holder 36 so as to surround a peripheral portion of the substrate holder 36. The substrate holder 36 rotates at an arbitrary acceleration and an arbitrary velocity integrally with the electrode section 38. Substrate carry-in-and-out openings (not shown) are provided in a sidewall of the plating apparatus 12 facing the transfer robot 14.

The plating solution tray 22 serves to wet a high-resistance structure 74 and an anode 98 (to be described later on) of the electrode head 28 with a plating solution when plating has not been performed. The plating solution tray 22 is set at a size in which the high-resistance structure 74 can be accommodated, and the plating solution tray 22 has a plating solution supply port and a plating solution drainage port (not shown). A photo-sensor is attached to the plating solution tray 22, and can detect brimming with the plating solution in the plating solution tray 22, i.e., overflow, and drainage.

The electrode arm section 30 is vertically movable by a vertical movement motor, which is a servomotor, and a ball screw (not shown), and swingable (pivotable) between the plating solution tray 22 and the substrate processing section 20 by a swing motor.

The pre-coating/recovering arm 32 is coupled to an upper end of a vertical support shaft. The pre-coating/recovering arm 32 is swingable (pivotable) by a rotary actuator (not shown) and is also vertically moveable by an air cylinder (not shown). The pre-coating/recovering arm 32 supports a pre-coating nozzle (not shown) for intermittently discharging a pre-coating liquid, and a plating solution recovering nozzle (not shown) for drawing and recovering the plating solution on the substrate, respectively.

The electrode section 38 has cathode contacts 44 comprising six cathode contacts, in this embodiment, and a ring-shaped seal member 46 disposed above the cathode contacts 44 so as to cover upper surfaces of the cathode contacts 44. The cathode contacts 44 are provided on top of support posts 42 mounted vertically on the peripheral upper surface of a substrate stage 40. The seal member 46 has an inner circumferential portion which is inclined inwardly and downwardly so that a thickness of the seal member 46 is gradually reduced.

When the substrate W held by the substrate holder 36 is raised, the cathode contacts 44 are brought into contact with peripheral portions of the seed layer 7, formed on the surface of the substrate W, as a conductive film, so that electricity can be fed to the seed layer 7 to be a cathode. At the same time, the inner peripheral end portion of the seal member 46 presses on and water-tightly seals the peripheral upper surface of the substrate W, thus preventing the plating solution, supplied to the upper surface (surface to be plated) of the substrate W, from leaking from the end of the substrate W and also preventing the plating solution from contaminating the cathode contacts 44.

In this embodiment, the electrode section 38 is not movable vertically, but is rotatable together with the substrate holder 36. However, the electrode section 38 may be designed to be movable vertically so that the seal member 46 is brought into close contact with the surface, to be plated, of the substrate W when the electrode section 38 is moved downwardly.

Figure 10:
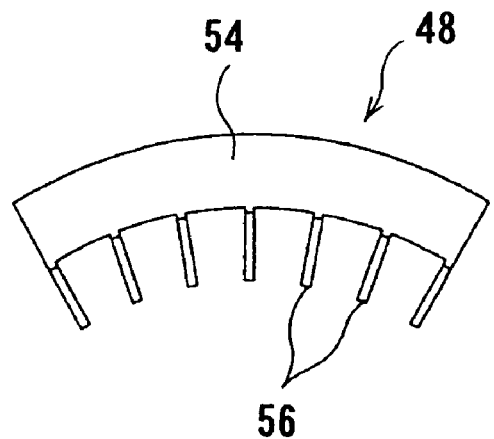
FIG. 10 is a plan view showing an auxiliary cathode of the plating apparatus shown in FIG. 7.

A plurality of auxiliary cathodes 48, formed of a metal, such as a stainless steel or titanium, and having the shape of a ring as a whole, are mounted on an upper surface of the seal member 46 by a presser ring 50 and cap screws 52. In order to avoid dissolution of the auxiliary cathode 48 in a plating solution and to prevent the formation of a passive film in the surface, the surface of the auxiliary cathode 48 may be coated with a noble metal, such as platinum, e.g., by vapor deposition. As shown in FIG. 10, the auxiliary cathode 48 according to this embodiment is comprised of an arc-shaped support plate 54, and a plurality of strips 56 having spring properties and bonded to an inner end surface of the support plate 54. Such an auxiliary cathode 48 has good adhesion of the strips 56 to the seal member 46 while securing flexibility of the strips 56 and thus can prevent leakage of liquid and, in addition, can eliminate the use of a costly draw mold.

Figure 14A:
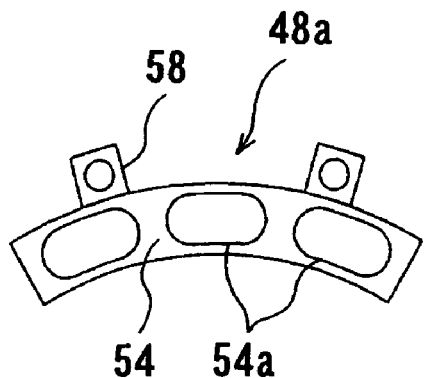
FIG. 14A is a plan view showing another auxiliary cathode.
Figure 14B:
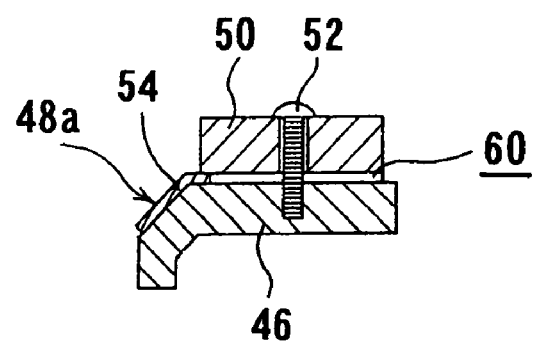
FIG. 14B is a cross-sectional view showing the auxiliary cathode mounted to a seal member.

It is also possible to use auxiliary cathodes 48a, as shown in FIG. 14A, having the shape of a ring as a whole. Each auxiliary cathode 48a is comprised of an arc-shaped support plate 54 having through-holes 54a therein, and outwardly-projecting mounting pieces 58 provided on an outer end surface of the support plate 54. When mounting the auxiliary cathode 48a on the surface of the seal member 46 by a presser ring 50 and cap screws 52, as shown in FIG. 14B, the outer end portion of the support plate 54 of the auxiliary cathode 48a and the inner end portion of the presser ring 50 overlap with each other linearly, and spaces 60 are formed between the seal member 46 and the auxiliary cathodes 48a.

The auxiliary cathode 48a can increase the exposed area of the slope portion of the seal member 46 so that a liquid pool is less likely to be formed on the slope portion. On the other hand, there is a fear with such an auxiliary cathode 48a of a slight leakage of plating solution through a narrow gap, which can be formed between the auxiliary cathode 48a and the seal member 46, upon high-speed rotation of the substrate holder 36. The possible leakage of plating solution, however, can be prevented by creating the spaces 60 between the seal member 46 and the auxiliary cathodes 48a, and cleaning the spaces 60 with the same rinsing water as that for rinsing of a substrate before rotating the substrate holder 36 at a high speed. This can thus prevent a plating solution from leaking through the gap between the seal member 46 and the auxiliary cathode 48a and bouncing off a surrounding drip-proof cup, which could cause oxidation and staining of a substrate surface.

Figure 15A:
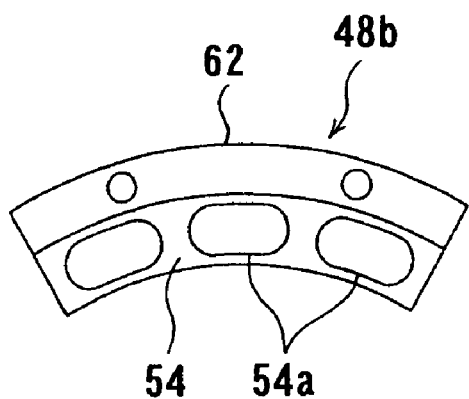
FIG. 15A is a plan view showing yet another auxiliary cathode.
Figure 15B:
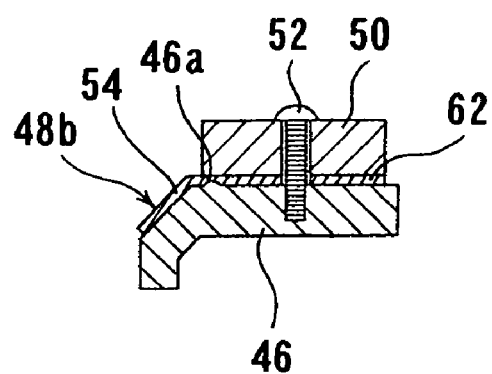
FIG. 15B is a cross-sectional view showing the auxiliary cathode mounted to a seal member.

Further, it is also possible to use an auxiliary cathode 48b as shown in FIG. 15A, comprised of an arc-shaped support plate 54 having through-holes 54a therein, and a bendable plate 62 bonded to the outer end surface of the support plate 54, and to provide a steepled projection 46a on the surface of the seal member 46, as shown in FIG. 15B, so that when mounting the auxiliary cathode 48b on the surface of the seal member 46 by a presser ring 50 and cap screws 52, the projection 46a of the seal member 46 makes pressure contact with the bendable plate 62 of the auxiliary cathode 48b to effect liquid sealing between the seal member 46 and the auxiliary cathode 48b.

Figure 11:
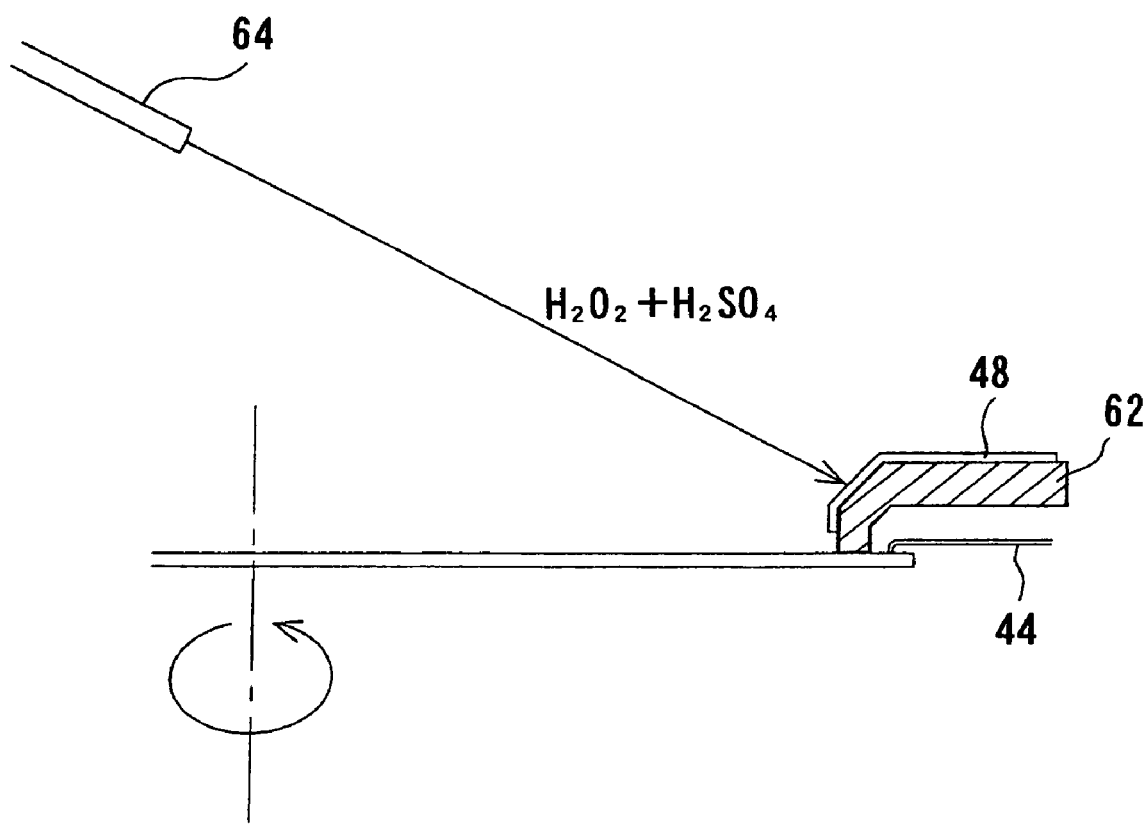
FIG. 11 is a diagram showing a cleaning agent jet nozzle (auxiliary cathode cleaning section) of the plating apparatus shown in FIG. 7.

As shown in FIG. 11, beside the electrode section 38 is provided an auxiliary cathode cleaning section comprising cleaning agent jet nozzles 64 for jetting a cleaning agent toward the auxiliary cathodes 48 to clean the auxiliary cathodes 48. According to this embodiment, a cleaning agent (chemical solution), which may be an inorganic or organic acid, such as sulfuric acid, hydrochloric acid, phosphoric acid, hydrofluoric acid or formic acid, or a mixture of such an acid with hydrogen peroxide, is jetted from the cleaning agent jet nozzles (auxiliary cathode cleaning section) 64 toward the auxiliary cathodes 48 to dissolve and remove, for example, an unnecessary plated film formed on surfaces of the auxiliary cathodes 48. Hydrogen peroxide may be used singly as a cleaning agent. In this case, the auxiliary cathodes 48 can be cleaned by supplying the plating solution and hydrogen peroxide simultaneously to the auxiliary cathodes 48.

When plating is carried out by supplying an electric current between the auxiliary cathodes 48 and the anode 78, as described below, plated films are formed on surfaces of the auxiliary cathodes 48. According to this embodiment, the unnecessary plated films formed on the auxiliary cathodes 48 can be dissolved by chemical etching with the cleaning agent (chemical solution) supplied from the cleaning agent jet nozzles (auxiliary cathode cleaning section) 64 and removed.

As shown in FIG. 9, the electrode head 28 of the electrode arm section 30 includes an anode holder 72 which is coupled via a ball bearing (not shown) to the free end of the swing arm 26, and a high-resistance structure 74 which is disposed such that it closes the lower opening of the anode holder 74. A hollow anode chamber 76 is thus defined in the anode holder 72.

The high-resistance structure 74 is, for example, composed of porous ceramics such as alumina, SiC, mullite, zirconia, titania or cordierite, or a hard porous material such as a sintered compact of polypropylene or polyethylene, or a composite material comprising these materials, or a woven fabric or a non-woven fabric. If alumina-based ceramics is used as the material of the high-resistance structure 74, then it has a pore diameter ranging from 30 to 200 μm. If SiC is used as the material of the high-resistance structure 74, then it has a pore diameter of 30 μm or less. These ceramics have a porosity ranging from 20 to 95%. The high-resistance structure 74 has a thickness in the range from 1 to 20 mm, preferably in the range from 5 to 20 mm, and more preferably in the range from 8 to 15 mm. The high-resistance structure 72, in this embodiment, is constituted of porous ceramics of alumina having a porosity of 30%, and an average pore diameter of 100 μm. The porous ceramic plate per se is an insulator, but the high-resistance structure is constituted so as to have a smaller conductivity than the plating solution by causing the plating solution to enter its interior complicatedly and follow a considerably long path in the thickness direction.

The high-resistance structure 74, which has the higher resistance, is disposed at the opening of the anode chamber 76. Hence, the influence of the resistance of the seed layer 7 becomes a negligible degree. Consequently, the difference in current density over the surface of the substrate due to electrical resistance on the surface of the substrate W becomes small, and the uniformity of the plated film over the surface of the substrate improves.

An anode 78, which has a number of vertical through holes defined therein, is disposed in the anode chamber 76 located above the high-resistance structure 74. The anode holder 72 has a plating solution discharge port 80 for discharging, under suction, the plating solution from the anode chamber 76. The plating solution discharge port 80 is connected to a plating solution discharge pipe (not shown) extending from the plating solution supply equipment 18 (see FIG. 7). A plating solution introducing portion 82 is provided beside the anode holder 72. In this embodiment, the plating solution introducing portion 82 comprises a tube having a lower end shaped as a nozzle, and is connected to a plating solution supply pipe (not shown) extending from the plating solution supply equipment 18 (see FIG. 7).

The electrode head 28 is lowered until the gap between the substrate W held by the substrate holder 36 and the high-resistance structure 74 becomes about 0.5 to 3 mm, for example, and then the plating solution introducing portion 82 pours the plating solution into a region between the substrate W and the high-resistance structure 74 from laterally of the anode 78 and the high-resistance structure 74.

In order to suppress slime formation, the anode 78 is made of copper (phosphorus-containing copper) containing 0.03 to 0.05% of phosphorus. It is also possible to use an insoluble material for the anode.

Figure 12:
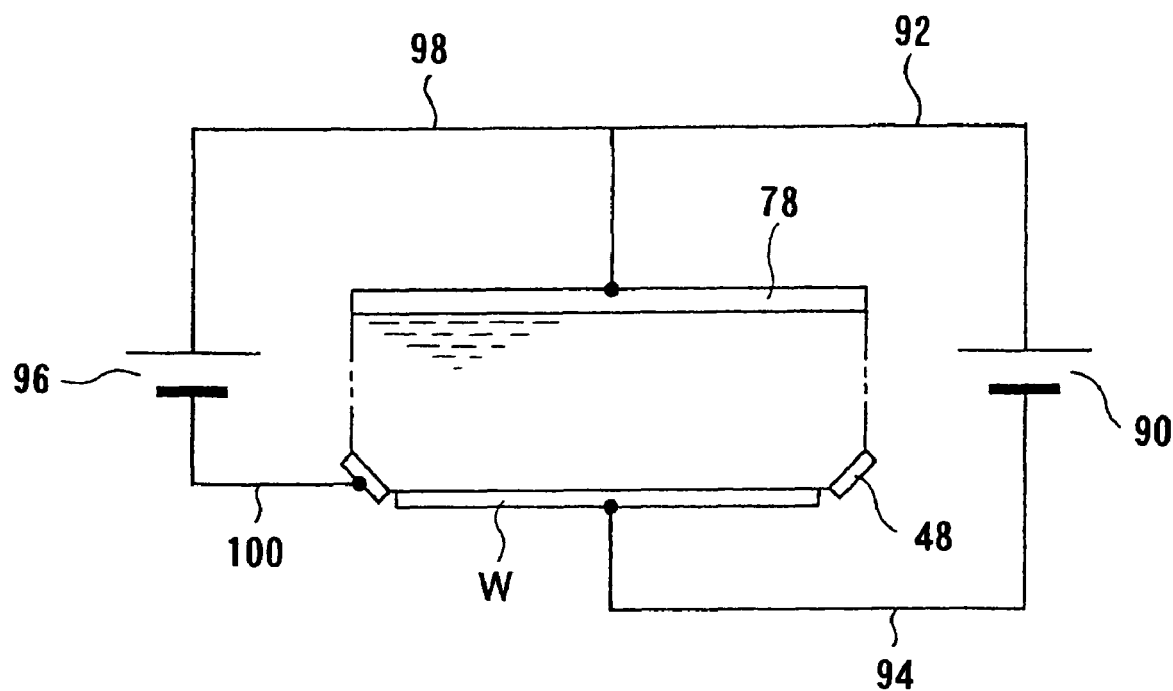
FIG. 12 is a schematic circuit diagram of the plating apparatus shown in FIG. 7.

As shown in FIGS. 9 and 12, the anode side of a plating power source 90 is electrically connected to the anode 78 via an anode-side conducting wire 92, and the cathode side of the plating power source 90 is electrically connected to each cathode contact 44 via a cathode-side conducting wire 94. Besides the plating power source 90, the plating apparatus is also provided with an auxiliary power source 96. The anode side of the auxiliary power source 96 is electrically connected to the anode 78 via an anode-side conducting wire 98, and the cathode side of the auxiliary power source 96 is electrically connected to each auxiliary cathode 48 via a cathode-side conducting wire 100. The plating apparatus also includes a control section 102 for controlling the plating power source 90 and the auxiliary power source 96. Plating of the substrate W can thus be carried out by supplying electric current from the plating power source 90 and the auxiliary power source 96 to between the anode 78 and the seed layer 7 of the substrate W and between the anode 78 and the auxiliary cathodes 48.

Next, the operation of the substrate processing apparatus, incorporating the plating apparatus 12 of this embodiment, will now be described.

First, a substrate W before plating is taken by the transfer robot 14 out of the loading/unloading section 10, and the substrate W, with its front surface (surface to be plated) facing upwardly, is carried into one of the plating apparatuses 12 through the substrate carry-in-and-out opening provided in the sidewall of the frame. The substrate holder 36 attracts and holds the substrate W on its back surface (lower surface). After retreating the hand of the robot, the substrate holder 36 is raised to bring the cathode contacts 44 into contact with the seed layer 7 of the substrate W so that electricity can be fed to the seed layer 7, while the seal member 46 contacts the peripheral end surface of the substrate W to water-tightly seal the peripheral end surface.

Meanwhile, the electrode head 28 of the electrode arm section 30 is in a normal position over the plating solution tray 22, and the high-resistance structure 74 or the anode 78 is positioned in the plating solution tray 22. Then, the plating solution starts being supplied to the plating solution tray 22 and the electrode head 28. Until the step of plating the substrate W is initiated, the new plating solution is supplied, and the plating solution discharge pipe (not shown) is evacuated to replace the plating solution in the high-resistance structure 74 and remove air bubbles from the plating solution in the high-resistance structure 74.

Next, the pre-coating step is initiated. Specifically, the substrate holder 36, which has received the substrate W, is rotated, and the pre-coating/recovering arm 32 is moved from the retracted position to a position confronting the substrate W. When the rotational speed of the substrate holder 36 reaches a preset value, the pre-coating nozzle (not shown) mounted on the tip end of the pre-coating/recovering arm 32 intermittently discharges a pre-coating liquid which comprises a surfactant, for example, toward the surface (surface to be plated) of the substrate W. At this time, since the substrate holder 36 is rotating, the pre-coating liquid spreads all over the surface of the substrate W. Then, the pre-coating/recovering arm 32 is returned to the retracted position, and the rotational speed of the substrate holder 36 is increased to spin the pre-coating liquid off and dry the surface to be plated of the substrate W.

After the completion of pre-coating, the process goes on to plating. First, the rotation of the substrate holder 36 is stopped or slowed down to a plating speed. Based on a signal indicating the completion of pre-coating of the substrate W, the electrode arm section 30 is pivoted horizontally to move the electrode head 28 from the position above the plating solution tray 22 to a position above a plating position. Thereafter, the electrode head 28 is lowered toward the electrode section 38, and stopped when the high-resistance structure 74 comes to a position close to the surface of the substrate W, e.g., at a distance of about 0.5 mm to 3 mm from the substrate W. When the lowering of the electrode head 28 is completed, the plating solution is supplied between the substrate W and the high-resistance structure 74 to bring the anode 78, the surface seed layer 7 (see FIG. 1A) of the substrate W and part of each auxiliary cathode 48 into contact with the plating solution. Then, the anode of the plating power source 90 is electrically connected to the anode 78, while the cathode of the plating power source 90 is electrically connected to the cathode contacts 44. Further, the anode of the auxiliary power source 96 is electrically connected to the anode 78, while the cathode of the auxiliary power source 96 is electrically connected to the auxiliary cathodes 48. Thus, plating is carried out by supplying electric currents between the anode 78 and the seed layer 7, and between the anode 78 and the auxiliary cathodes 48 via the power source 96 and the auxiliary power source 96. During plating, the substrate W held by the substrate holder 36 is rotated at a low speed, according to necessity.

By supplying electric currents between the anode 78 and the seed layer 7 of the substrate W, and also between the anode 78 and the auxiliary cathodes 48 disposed such that they surround the periphery of the substrate W held by the substrate holder 36 in carrying out plating, it becomes possible to make the density of electric lines of force uniform over the entire surface, including the peripheral surface, of the substrate W, thereby forming a plated film having a uniform thickness over the entire surface of the substrate.

The auxiliary power source 96 preferably is controlled by the control section 102 so that it operates in two modes: a constant-voltage mode of outputting a constant voltage; and a constant-current mode of outputting a constant current irrespective of load resistance. While the auxiliary cathodes 48 are getting immersed in the plating solution upon injection of the plating solution, the auxiliary power source 96 is set in the constant-voltage mode to apply a constant voltage between the auxiliary cathodes 48 and the anode 78, thus passing an electric current, which is proportional to the contact area of the auxiliary cathodes 48 with the plating solution, between the auxiliary cathodes 48 and the anode 78. This can keep the current density between the auxiliary cathodes 48 and the anode 78 constant, thereby avoiding breakage of the auxiliary cathodes 48 due to abnormal concentration of electric current and burnt plating in the substrate surface which may occur in the vicinity of the current concentration site.

After starting plating after completion of the injection of plating solution, the auxiliary power source 96 is switched to the constant-current mode to pass a constant electric current, controlled by the control section 102, between the auxiliary cathodes 48 and the anode 78 irrespective of individual differences of the auxiliary cathodes 48 and a change in the resistivity of the plating solution, so that plating can be carried out while applying the intended auxiliary cathode current. Table 1 below shows an example of a stepwise current recipe for applying optimal electric currents according to the progress of the formation of interconnects.

TABLE 1

| Step | time | power source mode | plating voltage/ current value | auxiliary power source mode | auxiliary anode voltage/ current value |
|---|---|---|---|---|---|
| 1 | 5 sec | constant voltage | 5 V | OFF | OFF |
| 2 | 10 sec | constant | 10 A | OFF | OFF |

TABLE 1-continued

| Step | time | power source mode | plating voltage/ current value | auxiliary power source mode | auxiliary anode voltage/ current value |
|---|---|---|---|---|---|
| 3 | 20 sec | constant current | 15 A | OFF | OFF |
| 4 | 30 sec | constant current | 20 A | constant current | 1 A |

After the completion of plating, the plating power source 90 and the auxiliary power source 96 are disconnected, and the electrode arm section 30 is raised and pivoted to return the electrode head 28 to above the plating solution tray 22, and is then lowered to the normal position. Next, the pre-coating/recovering arm 32 is moved from the retreat position to a position above the substrate W and is then lowered. A residual plating solution on the substrate W is recovered by the plating solution recovery nozzle (not shown). After completion of the recovery of the residual plating solution, the pre-coating/recovering arm 32 is returned to the retreat position, and pure water is supplied from the fixed pure water nozzle 34 to the central portion of the substrate W to rinse the plated surface of the substrate while rotating the substrate holder 36 at an increased speed, thereby replacing the plating solution on the substrate W with pure water.

Next, while rotating the substrate holder 36, a cleaning agent (chemical solution), such as a mixture of sulfuric acid with hydrogen peroxide, is jetted from the cleaning agent jet nozzles (auxiliary cathode cleaning section) 64 toward the auxiliary cathodes 48 to dissolve and remove, for example, an unnecessary plated film formed on surfaces of the auxiliary cathodes 48 by chemical etching. Thereafter, the surfaces of the auxiliary cathodes 48 are rinsed with pure water.

While rotating the substrate holder 36, pure water is supplied from the fixed pure water nozzle 34 to clean the substrate W. After stopping the supply of pure water from the fixed nozzle 34, the rotational speed of the substrate holder 36 is increased to drain off pure water on the surface of the substrate by centrifugal force.

All the process steps, i.e., the plating step and the associated pre-coating and cleaning/drying steps, are thus completed. The transfer robot 14 inserts its hand through the substrate carry-in-and-out opening into below the substrate W and raises the hand to receive the processed substrate W from the substrate holder 36, and then returns the substrate W to the loading/unloading section 10.

By thus applying a plating voltage (current) between the anode 78 and the cathode contacts 44 while applying a current (voltage) between the anode 78 and the auxiliary cathodes 48, and controlling the voltages (currents) applied, especially the current flowing between the anode 78 and the auxiliary cathodes 48, by the control section 102, it becomes possible to control a thickness of a plated film being formed on the surface (surface of the seed layer 7) of the substrate W and provide a flatter plated film over the entire surface of the substrate W.

Figure 13:
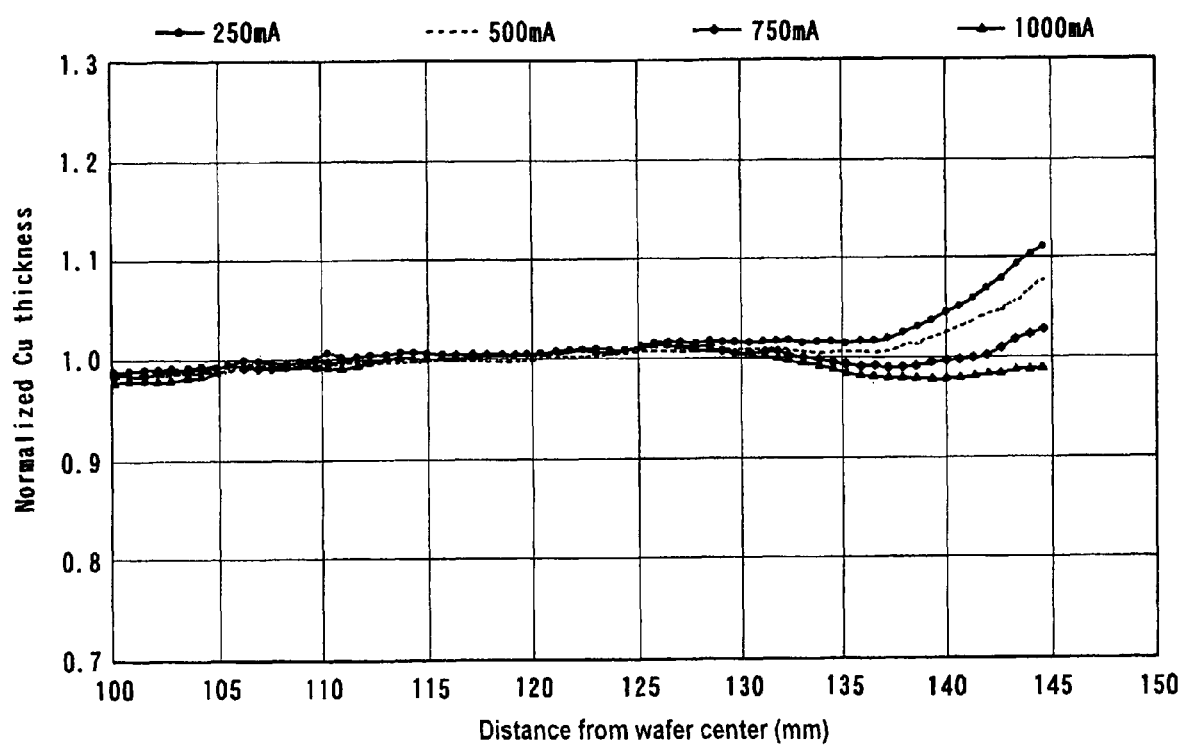
FIG. 13 is a graph showing the relationship between the normalized film thicknesses and the distance from the center of a substrate (wafer) of plated films as formed on the substrate surface by plating with various current values between an anode and an auxiliary cathode.

FIG. 13 shows the relationship between the normalized film thicknesses and the distance from the center of substrate (wafer) of plated films as formed on the surface of the substrate by plating with various current values between the anode 78 and the auxiliary cathodes 48, specifically 250 mA, 500 mA, 750 mA and 1000 mA. As can be seen from FIG. 13, a change in the plating current flowing between the anode 78 and the auxiliary cathodes 48 produces a change in a thickness of a plated film, especially in the peripheral region of the substrate. It will, therefore, be understood that a flatter plated film can be formed over the entire surface of the substrate without a change of members by controlling the plating current flowing between the anode 78 and the auxiliary cathodes 48 depending on the plating conditions, the state of the substrate, etc.

Figure 16:
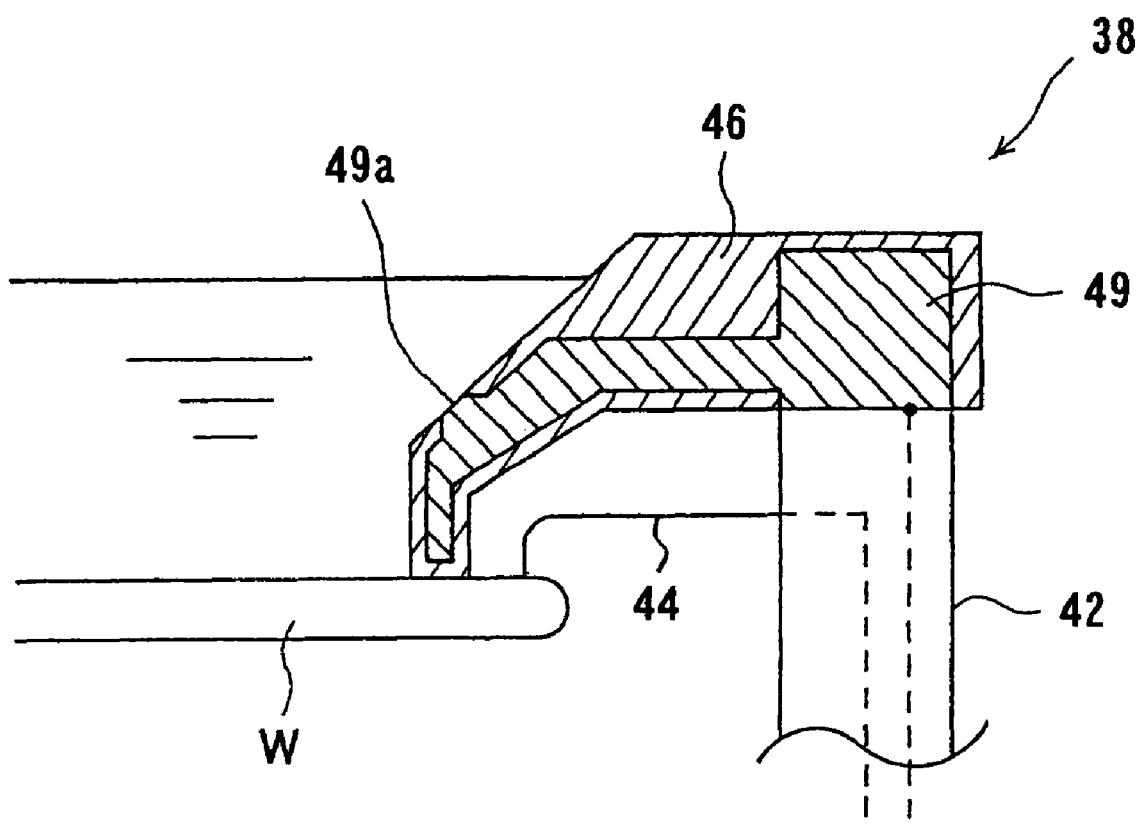
FIG. 16 is a cross-sectional view showing yet another auxiliary cathode mounted to a seal member.

FIG. 16 shows another auxiliary cathode. The auxiliary cathode 49, for the most part, is embedded in the seal member 46 with only an exposed portion 49a partly exposed on the surface of the seal member 46. The auxiliary cathode 49 permits the formation of an unnecessary plated film only on the exposed portion 49a during plating, thus reducing the area of unnecessary plated film formation.

FIGS. 17 and 18 schematically show other electric circuit constructions. The electric circuit shown in FIG. 17 is not provided with an auxiliary power source, and applies part of the voltage from the plating power source 90 to between the auxiliary cathodes 48 and the anode 78 by switching a switch 110. The electric circuit shown in FIG. 18 uses a variable resistor 112 instead of the switch 110 of FIG. 17 to apply part of the voltage from the plating power source 90 to between the auxiliary cathodes 48 and the anode 78, and controls the voltage applied by changing the resistance of the variable resistor 112. The electric circuits shown in FIGS. 17 and 18, which both employ the sole power source, have the advantages of lower cost and space saving.

Figure 19:
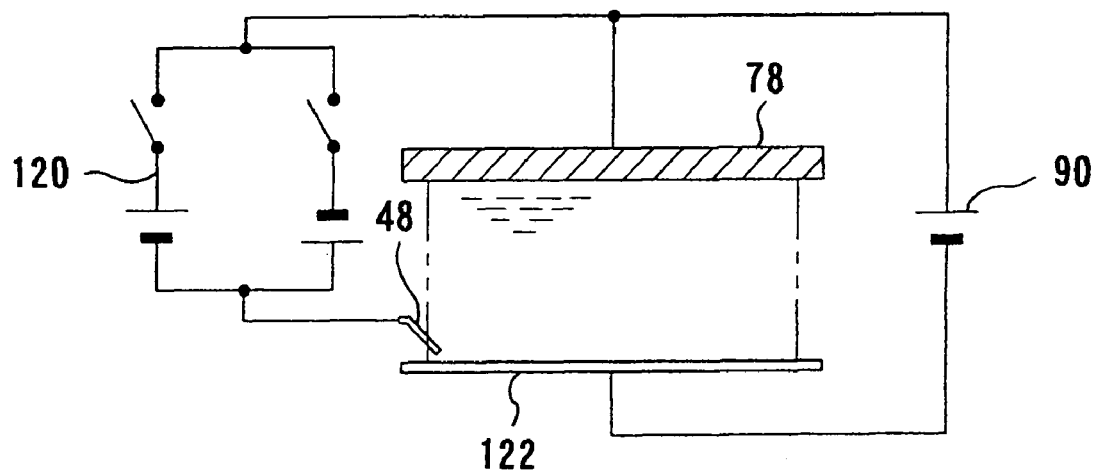
FIG. 19 is a schematic diagram showing another auxiliary cathode cleaning section.

FIG. 19 shows another auxiliary cathode cleaning section. This auxiliary cathode cleaning section includes an auxiliary power source 120 capable of reversing the polarity, which is employed in place of the above-described auxiliary power source 96, and a dummy substrate 122 having a film of, e.g., copper formed on a surface. When the space between the anode 78 and the dummy substrate 122, held by the substrate holder 36 (see FIG. 9), is filled with a plating solution with part of each auxiliary cathode 48 in contact with the plating solution, such a voltage as to make the anode 78 serve as a cathode and the auxiliary cathodes 48 an anode, is applied from the auxiliary power source 120 to between the anode 78 and the auxiliary cathodes 48, thereby cleaning off, by etching, plated films of, e.g., copper formed on surfaces of the auxiliary cathodes 48.

Figure 20:
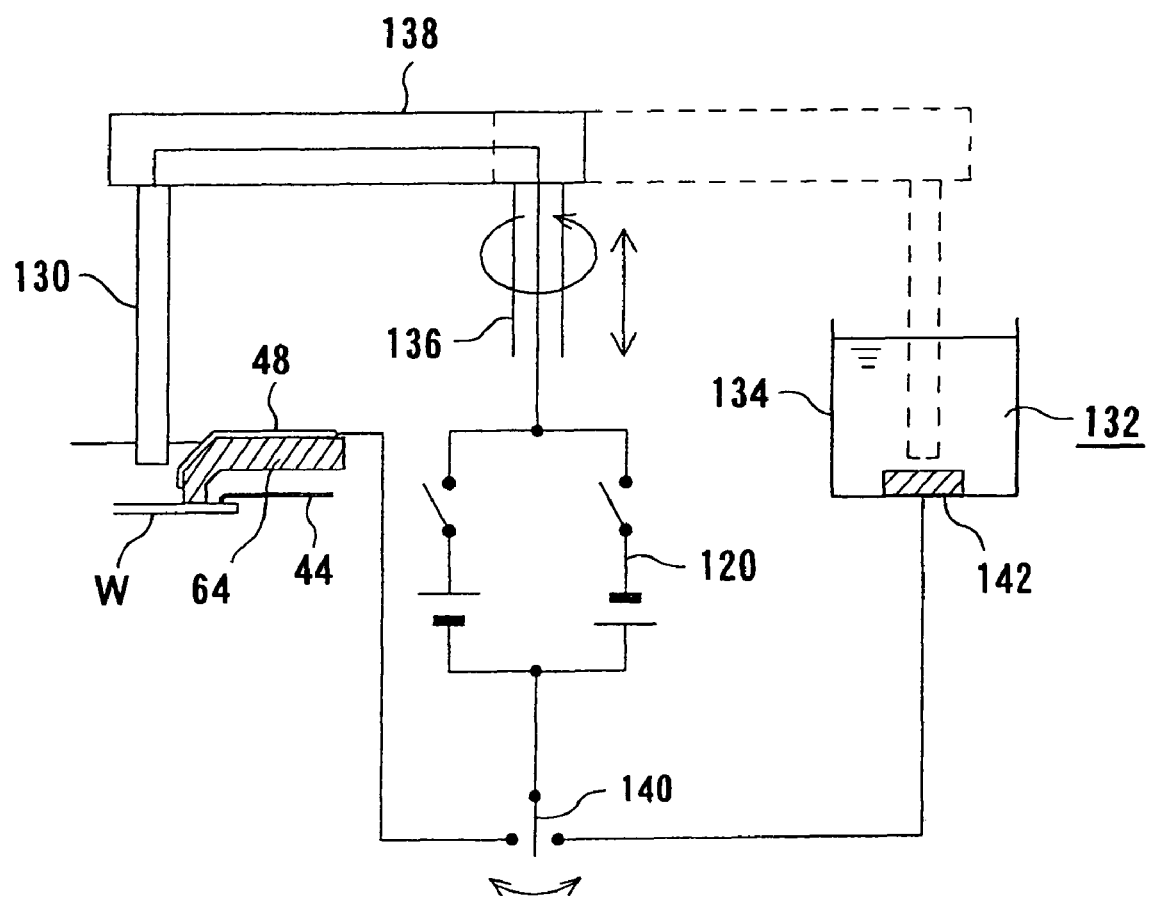
FIG. 20 is a schematic diagram showing yet another auxiliary cathode cleaning section.

FIG. 20 shows yet another auxiliary cathode cleaning section. This auxiliary cathode cleaning section includes an auxiliary power source 120 capable of reversing the polarity, which is employed in place of the above-described auxiliary power source 96, a rod-like cleaning electrode 130, and an electrolytic solution tank 134 holding an electrolytic solution 132. The cleaning electrode 130 is vertically mounted to the free end of a support arm 138 coupled to the upper end of a rotatable and vertically-movable support shaft 136, and is movable between a position at which the lower end of the cleaning electrode 130 is immersed in a plating solution held on the upper surface of a substrate W and a position at which the lower end cleaning electrode 130 is immersed in the electrolytic solution 132 in the electrolytic solution tank 134. The electrolytic solution tank 134 is provided at the bottom with a dummy cathode 142 which, during cleaning of the auxiliary cathodes 48, is connected to the cathode of the auxiliary power source 120 by a switch 140.

In operation, the lower end of the cleaning electrode 130 is immersed in the plating solution, held on the upper surface of the substrate W, after the completion of plating, and such a voltage as to make the cleaning electrode 130 serve as a cathode and the auxiliary cathodes 48 serve as an anode, is applied from the auxiliary power source 120 to between the cleaning electrode 130 and the auxiliary cathodes 48, thereby cleaning off, by etching, plated films of, e.g., copper formed on surfaces of the auxiliary cathodes 48. After thus cleaning the auxiliary cathodes 48, the lower end of the cleaning electrode 130 is immersed in the electrolytic solution 132 in the electrolytic solution tank 134, and such a voltage as to make the cleaning electrode 130 serve as an anode and the dummy cathode 142 a cathode, is applied from the auxiliary power source 120 to between the cleaning electrode 130 and the dummy cathode 142, thereby etching away a plated film of, e.g., copper formed on the lower end portion of the cleaning electrode 130 during the cleaning of the auxiliary cathodes 48.

Though the above embodiments are adapted to hold a substrate face up in carrying out plating of the substrate, the present invention is also applicable to a plating method that holds a substrate face down in carrying out plating of the substrate. Further, though copper is used as an interconnect material in the above embodiments, it is also possible to use a copper alloy, silver or a silver alloy.

Although certain preferred embodiments of the present invention have been shown and described in detail, it should be understood that various changes and modifications may be made therein without departing from the scope of the appended claims.

What is claimed is:
1. A plating apparatus comprising:
a substrate holder for holding a substrate;
a cathode contact for contacting a conductive film formed on the substrate to be held by the substrate holder to feed electricity to the conductive film so that the conductive film serves as a cathode;
a ring-shaped seal member for covering the cathode contact such that an inner circumferential portion of the seal member is brought into contact with a peripheral portion of the substrate to be held by the substrate holder to seal the peripheral portion of the substrate;
an anode disposed so as to face the conductive film formed on the substrate to be held by the substrate holder;
an auxiliary cathode mounted to the seal member such that at least part of the auxiliary cathode is exposed on a surface of the seal member; and
an auxiliary cathode cleaning section for cleaning a surface of the auxiliary cathode;
wherein plating is carried out by bringing the conductive film, the anode and the auxiliary cathode into contact with a plating solution.
2. The plating apparatus according to claim 1, further comprising a high-resistance structure disposed between the anode and the substrate.
3. The plating apparatus according to claim 1, wherein the auxiliary cathode cleaning section includes a cleaning electrode or dummy substrate, and is adapted to etch away a plated film formed on a surface of the auxiliary cathode by making the auxiliary cathode serve as an anode and the cleaning electrode or dummy substrate serve as a cathode.

* * * * *